United States Patent
Shao et al.

(10) Patent No.: US 9,559,725 B1
(45) Date of Patent: Jan. 31, 2017

(54) MULTI-STRENGTH REED-SOLOMON OUTER CODE PROTECTION

(71) Applicant: Seagate Technology LLC, Cupertino, CA (US)

(72) Inventors: Rose Shao, Marlborough, MA (US); Ara Patapoutian, Hopkinton, MA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 104 days.

(21) Appl. No.: 14/061,344

(22) Filed: Oct. 23, 2013

(51) Int. Cl.
*H03M 13/29* (2006.01)
*H03M 13/15* (2006.01)

(52) U.S. Cl.
CPC ..... *H03M 13/2936* (2013.01); *H03M 13/1515* (2013.01); *H03M 13/2948* (2013.01)

(58) Field of Classification Search
CPC .................. G11B 2020/1853; H03M 13/2936; H03M 13/2948
See application file for complete search history.

(56) References Cited

U.S. PATENT DOCUMENTS

| | | | | |
|---|---|---|---|---|
| 5,321,725 A * | 6/1994 | Paik et al. ..................... | 375/265 |
| 5,699,365 A * | 12/1997 | Klayman et al. ............. | 714/708 |
| 6,968,494 B2 * | 11/2005 | Zhang ................... | H04B 7/0845 |
| | | | | 714/790 |
| 7,356,753 B2 * | 4/2008 | Chen ............................ | 714/755 |
| 7,536,625 B2 * | 5/2009 | Seng et al. .................... | 714/755 |
| 7,739,576 B2 | 6/2010 | Radke | |
| 7,814,398 B2 | 10/2010 | Djurdjevic et al. | |
| 7,827,461 B1 * | 11/2010 | Low et al. ..................... | 714/752 |
| 7,844,879 B2 | 11/2010 | Ramamoorthy et al. | |
| 7,876,638 B2 | 1/2011 | Pekny | |
| 8,166,364 B2 | 4/2012 | Patapoutian et al. | |
| 8,230,296 B2 * | 7/2012 | Belogolovy et al. ......... | 714/755 |
| 8,244,960 B2 | 8/2012 | Paley et al. | |
| 8,341,503 B1 * | 12/2012 | Yoon et al. .................... | 714/774 |
| 8,406,051 B2 | 3/2013 | Patapoutian et al. | |
| 8,448,045 B2 | 5/2013 | Reddy et al. | |
| 8,949,690 B2 * | 2/2015 | Sugahara ............ | G06F 11/1048 |
| | | | | 714/764 |
| 2006/0015801 A1 * | 1/2006 | Suh ..................... | G11B 20/1803 |
| | | | | 714/804 |
| 2007/0033362 A1 | 2/2007 | Sinclair | |
| 2007/0171714 A1 | 7/2007 | Wu et al. | |
| 2008/0163026 A1 * | 7/2008 | Varnica ............... | G06F 11/1008 |
| | | | | 714/755 |
| 2009/0013234 A1 | 1/2009 | Radke | |
| 2010/0142447 A1 * | 6/2010 | Schlicht .................. | H04W 4/20 |
| | | | | 370/328 |

(Continued)

OTHER PUBLICATIONS

Hasan, M.A.; Bhargava, V.K., "Architecture for a low complexity rate-adaptive Reed-Solomon encoder," Computers, IEEE Transactions on , vol. 44, No. 7, pp. 938, 942, Jul. 1995.*

*Primary Examiner* — Steve Nguyen
(74) *Attorney, Agent, or Firm* — Kagan Binder, PLLC

(57) ABSTRACT

A coding device, such as a memory device or communication system, comprising encoder circuitry configured to encode data into inner codewords and multiple-strength Reed-Solomon outer codewords, the Reed-Solomon outer codewords including weak strength, mid-strength, and strong strength. The strength of the codewords can be varied by changing at least one of the code length N, data length K, parity length R, symbol size S and code rate K/N.

19 Claims, 10 Drawing Sheets

(56) References Cited

U.S. PATENT DOCUMENTS

2010/0174846 A1 7/2010 Paley et al.
2010/0241923 A1 9/2010 Wang et al.
2011/0296272 A1 12/2011 Rub et al.
2012/0278679 A1* 11/2012 Rub et al. ..................... 714/755

* cited by examiner

Figure 8

MULTI-STRENGTH REED-SOLOMON OUTER CODE PROTECTION

SUMMARY

One particular embodiment of this disclosure is a coding device having encoder circuitry configured to encode data into low density parity check (LDPC) inner codewords and multiple-strength Reed-Solomon outer codewords.

Another particular embodiment of this disclosure is a coding device comprising encoder circuitry configured to encode data into low density parity check (LDPC) inner codewords and multiple-strength Reed-Solomon outer codewords.

Another particular embodiment of this disclosure is a method that includes constructing inner codes; constructing Reed-Solomon outer codes having a code length N, data length K, parity length R, and symbol size S, and varying the strength of the outer codes by changing at least one of the code length N, data length K, parity length R, and symbol size S; and iterating with a coding device between correcting the outer code and correcting the inner code.

Yet another particular embodiment of this disclosure is a method of providing two-level data protection in a coding device, the method including constructing inner codes; constructing Reed-Solomon outer codes having a code length N, data length K, parity length R, and symbol size S, and varying the strength of the outer codes by changing at least one of the code length N, data length K, parity length R and symbol size S; storing the variable strength Reed-Solomon outer codes in a plurality of sectors; and performing a cyclical downshift on sectors to provide equal protection across the sectors from the variable strength outer codes.

These and various other features and advantages will be apparent from a reading of the following detailed description.

BRIEF DESCRIPTION OF THE DRAWING

The disclosure may be more completely understood in consideration of the following detailed description of various embodiments of the disclosure in connection with the accompanying drawing, in which:

FIG. 8 shows an exemplary arrangement of inner codewords and variable strength outer codewords for one track;

DETAILED DESCRIPTION

Figure 1:
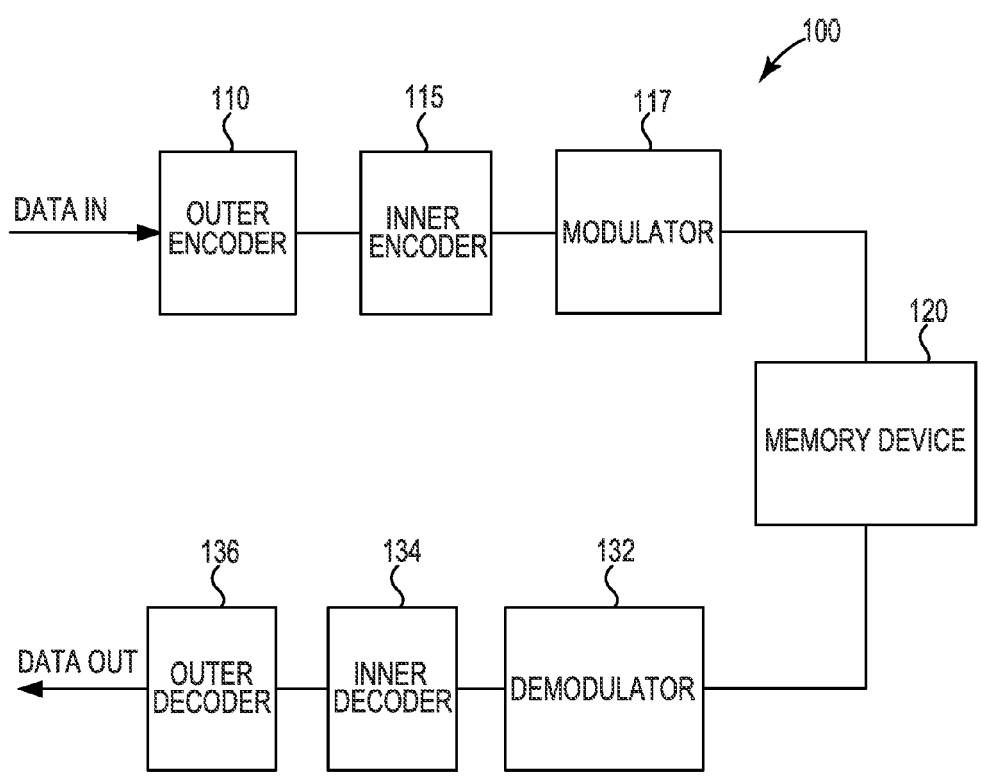
FIG. 1 is a block diagram illustrating a system configured to implement a concatenated coding scheme for a memory device.

The present embodiments are generally directed to providing two-level data protection for coding devices, where as used in this disclosure, a coding device is a device, system or apparatus that includes an error correcting, encoding, and decoding method or algorithm present in hardware or firmware. The protection is generally applicable to any device or system concerned about data integrity, whether in space or time. The two-level data protection may be used, for example, in memory devices such as hard disc drives (HDD), solid state drives (SSD), two-dimension magnetic recording (TDMR), and multi-sensor magnetic recording (MSMR). Additionally, the two-level data protection may be used in communication devices and communication systems that operate with at least one of a satellite communication system, a wireless communication system, a wired communication system, and a fiber-optic communication system. For such communication devices and systems, there is generally a first communication device at one end of a communication channel with encoder capability and second communication device at the other end of the communication channel with decoder capability. In many instances, one or both of these two communication devices includes encoder and decoder capability (e.g., within a bi-directional communication system).

Error correction becomes more important as technology moves to smaller dimensions and the need to store more data increases. Error correction using concatenated coding allows multiple codes to be used for enhanced error correction. Code concatenation reduces the complexity of the error correction process because it allows multiple, simpler error correction coding (ECC) to be implemented rather than a single more complex ECC. The use of concatenated inner and outer codes enhances error correction performance, allowing data to be more quickly recovered using less error protection when compared to approaches using single code alone. Outer codes can be arranged to protect particular logical and/or physical memory entities. For example, outer codewords that span multiple blocks can be used to protect against block failures. Similarly, outer codes that span multiple die can be used to protect against die failures; outer codes that span multiple chips can be used to protect against chip failures. The present invention provides an outer code with improved performance.

In this disclosure, low density parity check (LDPC) codes can be used in the first level as inner codes, and Reed-Solomon codes are used in the second level as outer codes. This disclosure is particularly directed to the construction of the outer Reed-Solomon codes, which provides better protection and/or performance when inner and outer codes are decoded iteratively. In accordance with this disclosure, the outer code includes multiple-strength Reed-Solomon (RS) codes. The use of variable strength outer codes improve successful iterative outer/inner decoding, thus improving the performance of the coding device.

The disclosure is also directed to the memory device utilizing the first level inner codes (e.g., LDPC) and the second level, multiple-strength Reed-Solomon (RS) outer codes. The memory device includes encoder circuitry configured to encode data into inner codewords and outer codewords. Modulator circuitry is configured to store the inner codewords and the outer codewords in the memory cells of the multiple blocks. The modulator circuitry is configured to store one or more inner codewords in each unit of each block and to store one or more outer codewords in at least one outer unit of each block, wherein a "unit" can be, for example, a sector (for magnetic memory) or a page (for SSD), and an "outer unit" can be, for example, a track (for magnetic memory) or span across multiple dies (for SSD). The memory device may further include demodulator circuitry configured to read the memory bits or symbols of the memory device and decoder circuitry configured to decode the inner codewords and the outer codewords and to correct errors in the inner codewords and the outer codewords. In some implementations, the decoder circuitry is configured to iterate between correcting the outer codewords and correcting the inner codewords.

Some embodiments involve a method of operating a device, such as a solid state non-volatile memory device. The device includes multiple data blocks, each block comprising an array of memory cells arranged in a plurality of units. Data is encoded into inner codewords and outer codewords and the inner codewords and outer codewords are stored in the device. Each unit of each block stores at least one inner codeword. One or more outer units of each block stores one or more symbols of each outer codeword. The inner codewords and the outer codewords are read from the device. Errors in the data are corrected using the inner codewords and the multiple-strength Reed-Solomon outer code. An error corrected output is provided from the corrected data. Correcting errors in the data using the inner codewords and the outer codewords involves iterating between correcting the outer codewords and correcting the inner codewords.

FIG. 1 is a block diagram illustrating a system configured to implement a concatenated coding scheme for a memory device 120. Incoming data to memory device 120 is encoded using both an inner encoder 115 and an outer encoder 110. Inner encoder 115 encodes the data into inner codewords and outer encoder 110 encodes the data into outer codewords. A modulator 117 receives the encoded data and generates signals required to store the encoded data in the cells of memory device 120.

When the stored data is accessed from the memory device, demodulator 132 senses the voltage levels present on the cells of memory device 120 and converts the stored voltage levels to an encoded binary signal. An inner decoder 134 corrects errors in the data using the inner parity data generated by inner encoder 115, and an outer decoder 136 corrects errors in the data using the outer parity data generated by outer encoder 110.

Figure 2:
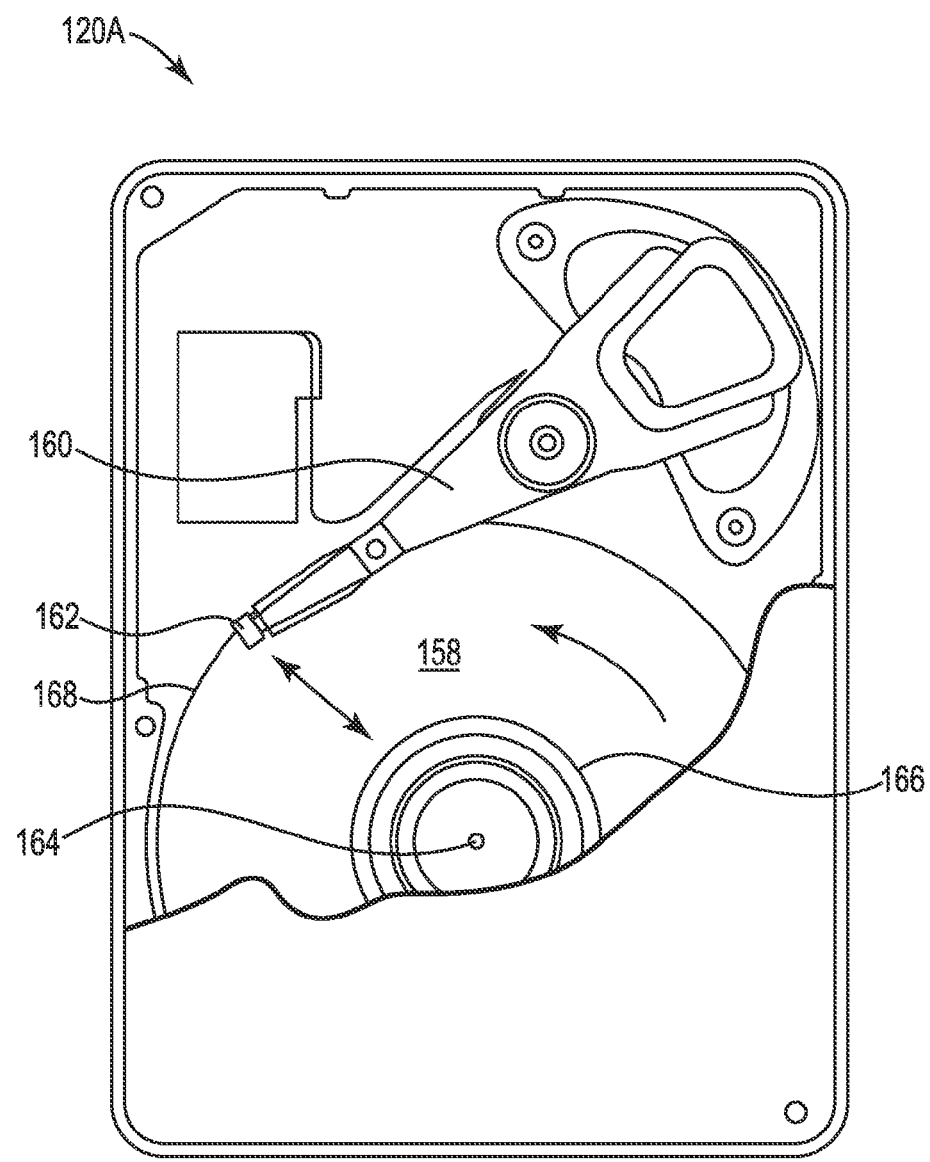
FIG. 2 is a schematic, top view of a disc drive memory device.

An exemplary memory device, particularly a magnetic disc drive 120A, is schematically illustrated in FIG. 2. Magnetic storage media 158 are attached to spindle 164 for co-rotation about a central axis. It should be noted that a pack of multiple discs or media 158 is utilized in some embodiments, and only a single disc or medium 158 is used in other embodiments. Each disc or medium surface has an associated slider 162 that is mounted adjacent to and in communication with its corresponding disc or media 158. Slider 162 includes a data recording transducer and a data reading transducer (also referred to as read/write heads, transducers, and the like), which read and write data to media 158. An actuator assembly 160 supports slider 162 and positions slider 162 and its read/write transducers over a desired data track along a path between an inner diameter 166 and an outer diameter 168 of media 158. The data tracks retain one or more bits of data.

Figure 3A:
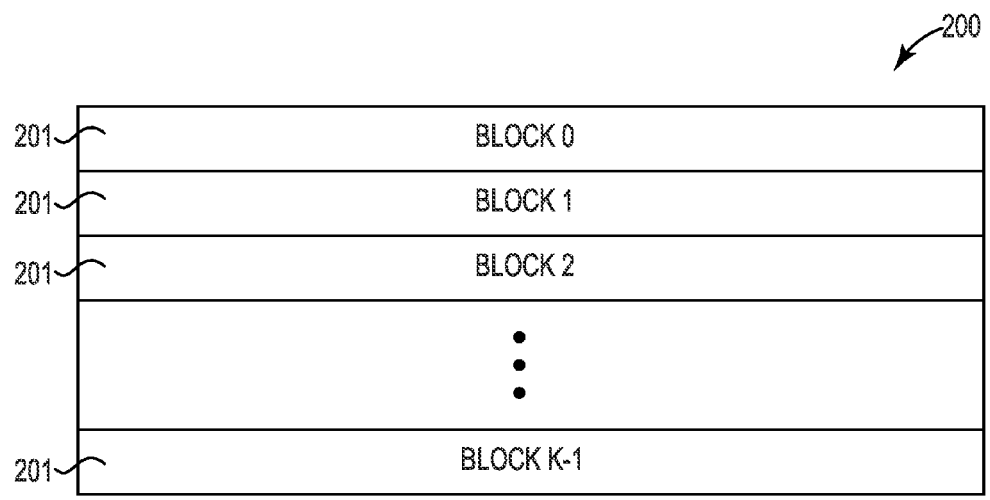
FIG. 3A illustrates a solid state memory cell array arranged in K blocks.
Figure 3B:
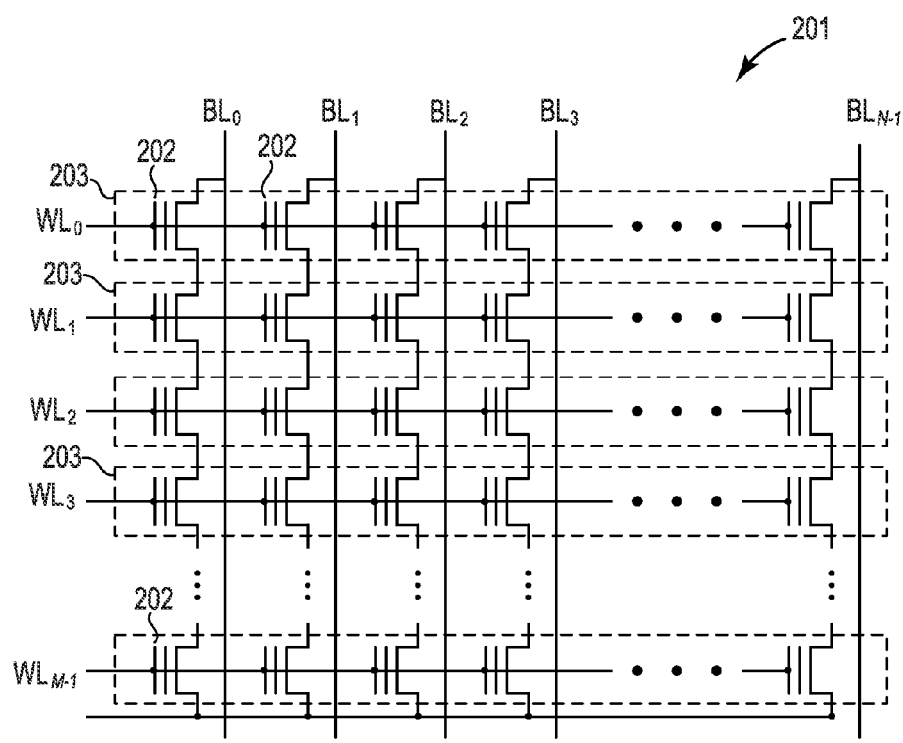
FIG. 3B illustrates an arrangement of one block of a memory cell array.
Figure 4:
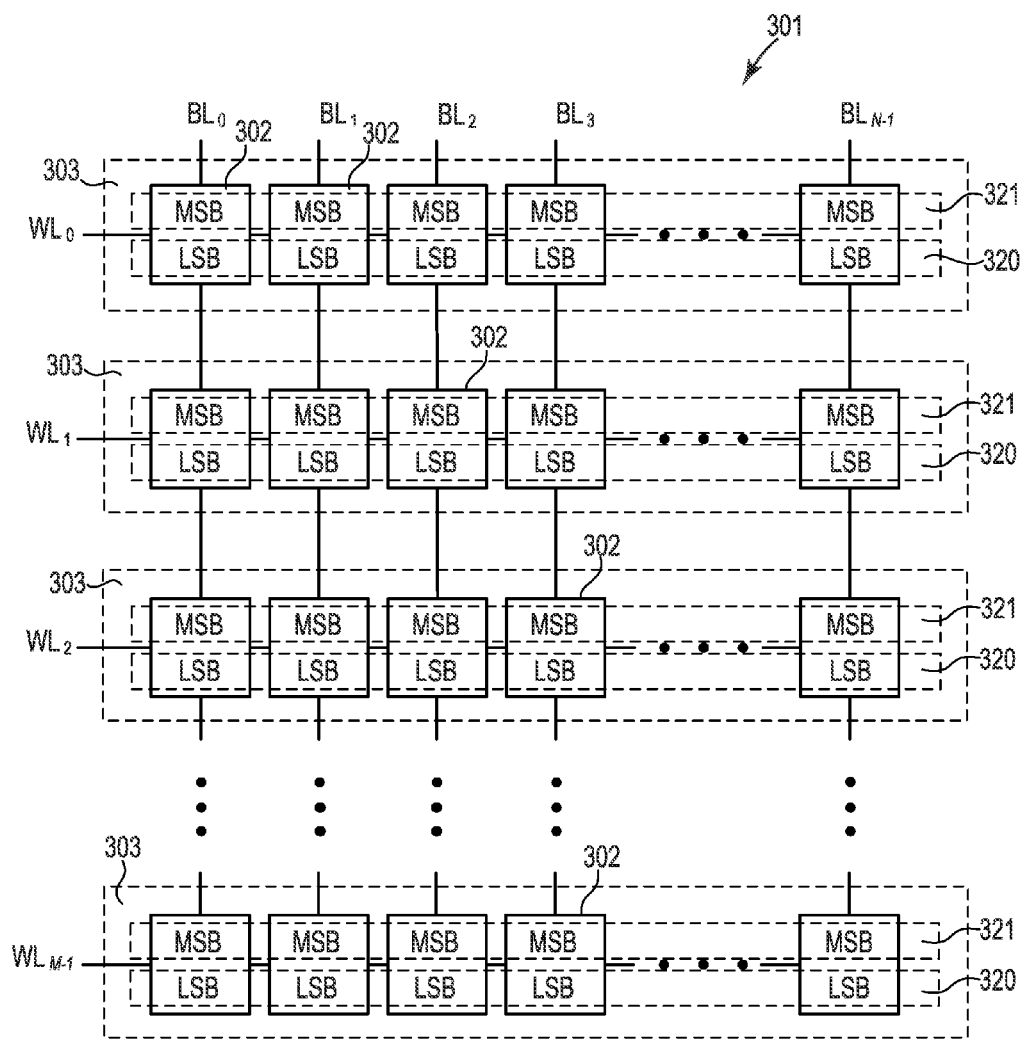
FIG. 4 illustrates a block of memory cells that are capable of storing two bits of information denoted as the most significant bit (MSB) and the least significant bit (LSB)
Figure 5:
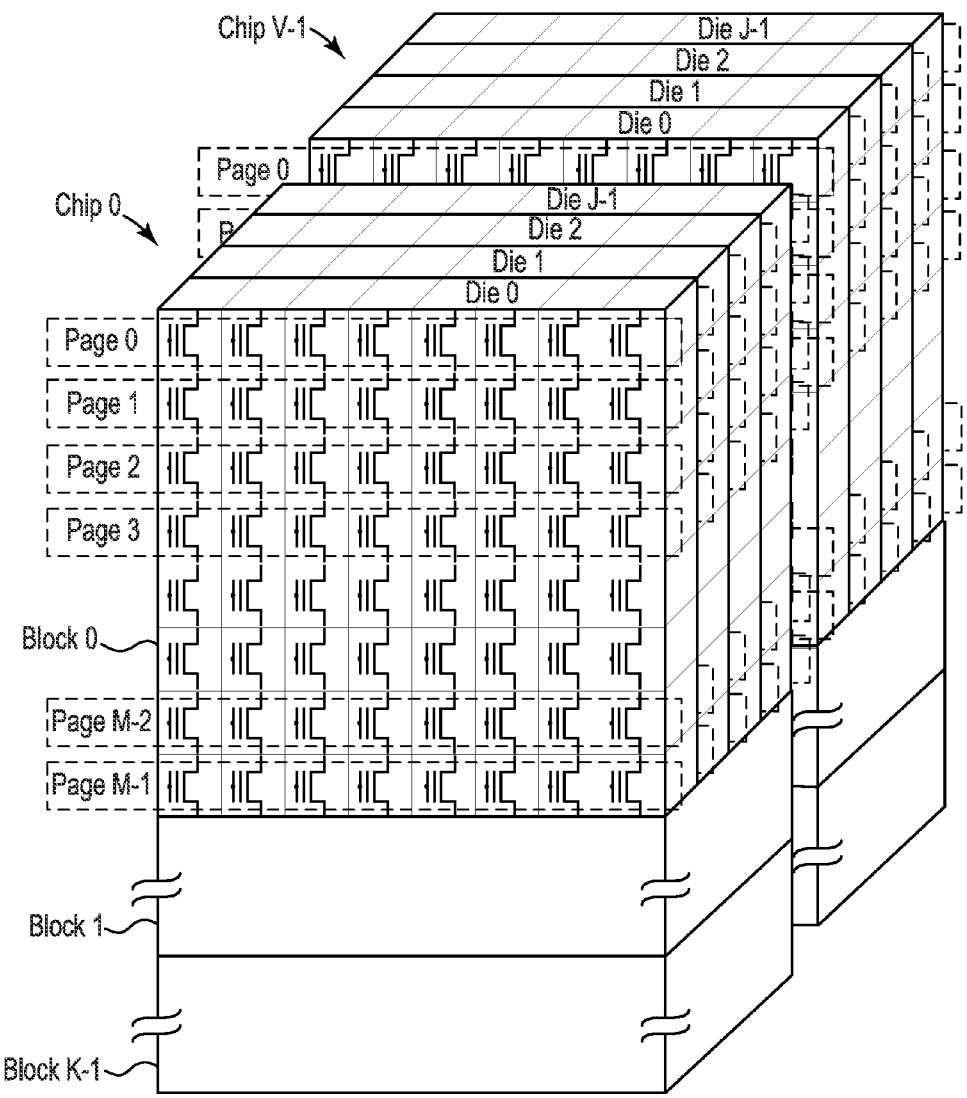
FIG. 5 illustrates an assimilation of multiple memory chips, each having multiple memory die, into an integrated circuit (IC) package.

FIGS. 3 through 5 show another exemplary memory device, particularly, a solid state or non-volatile memory (NVM) device. A typical non-volatile memory (NVM) device includes an array of memory cells, each memory cell including a floating gate transistor, which retain one or more bits of data. The memory cells in an array can be grouped into larger units, such as blocks, physical pages, and logical pages. An exemplary block size includes 64 physical pages of memory cells with 16,384 (16K) memory cells per physical page. Other block or page sizes can be used. FIG. 3A illustrates a memory cell array 200 arranged in K blocks 201. The memory cell array includes the 16K memory cells fabricated on a single semiconductor die.

FIG. 3B illustrates one block 201 of a memory cell array. The memory cell array has M×N memory cells per block 201; memory cells 202, or floating gate transistors 202, are arranged in M rows of physical pages 203 and in columns of NNAND strings. Each physical page 203 is associated with a word line (WL), $WL_0$ through $WL_{M-1}$. When a particular word line (WL) is energized, the N memory cells of physical page 203 associated with that particular WL are accessible on bit lines (BL) $BL_0$ through $BL_{N-1}$. In alternate embodiments, the memory cells of the solid state NVM may be arranged in a NOR array or in other array types, for example.

The exemplary memory block 201 may include memory cells that are capable of storing one bit per cell, or may include memory cells capable of storing two or more bits per memory cell. In general, the ability to program memory cells to a number of voltages, q, where q can represent any of $2^c$ memory states, allows c bits to be stored in each memory cell. In multi-level memory storage devices, c is greater than or equal to 2. For example, the memory cells may be programmable to four voltage levels and thus can store two bits of information per cell.

FIG. 4 illustrates a block 301 of memory cells 302 that are each capable of storing two bits of information denoted as the most significant bit (MSB) and the least significant bit (LSB). Although this example involves multi-level memory cells that store two bits per memory cell, in general, multi-level memory cells may store three, four bits, five bits or even more bits per memory cell.

When multi-level memory cells are used to form the memory array, each physical page 303 associated with a word line can be subdivided into multiple logical pages 320, 321, as illustrated in FIG. 4. One logical page 320, 321 for each type of bit may be stored in the memory cells 302 of the physical page 303. Memory cell arrays that subdivide one physical page into multiple logical pages corresponding to the number of bits stored in the multi-level memory cell are referred to herein as having 'multi-page architecture'. In the exemplary memory storage array block 301 illustrated in FIG. 4, each physical page 303 associated with a word line (WL) (i.e., $WL_0$ through $WL_{M-1}$) is subdivided into two logical pages 320, 321. The first logical page 320 includes the LSBs of memory cells 302 of physical page 303. The second logical page 321 includes the MSBs of memory cells 302 of physical page 303. The logical pages 320, 321 associated with physical page 303 are capable of being accessed (programmed or read) independently of each other. That is, the LSBs stored in the memory cells of the physical page are accessed using a first logical page address and the MSBs stored in the memory cells of the physical page are accessed using a second logical page address.

In some implementations, the memory cell array can be arranged so that a word line is associated with multiple physical pages and each physical page is further subdivided into multiple logical pages according to the number of bits stored by each memory cell.

To increase storage capacity, some memory integrated circuits (ICs) are packaged to include multiple memory chips, each memory chip having multiple memory die per memory chip, each die having multiple memory blocks per memory die. FIG. 5 illustrates an IC memory 400 that includes V memory chips, depicted in FIG. 5 as Chip 0 through Chip V–1. Each memory chip includes J die, depicted in FIG. 5 as Die 0 through Die J–1. Each die includes K blocks of memory cells, depicted in FIG. 5 as Block 0 through Block K–1. Block 0 of Die 0, Chip 0 is illustrated in detail showing the multiple memory cells per block, the memory cells of each block, are arranged in M physical pages.

The previous discussion, of FIGS. 2 through 5, provides examples of data storage or memory devices with which the protection code of this invention, particularly, having an outer code formed by multiple-strength Reed-Solomon code, is useful.

Figure 6:
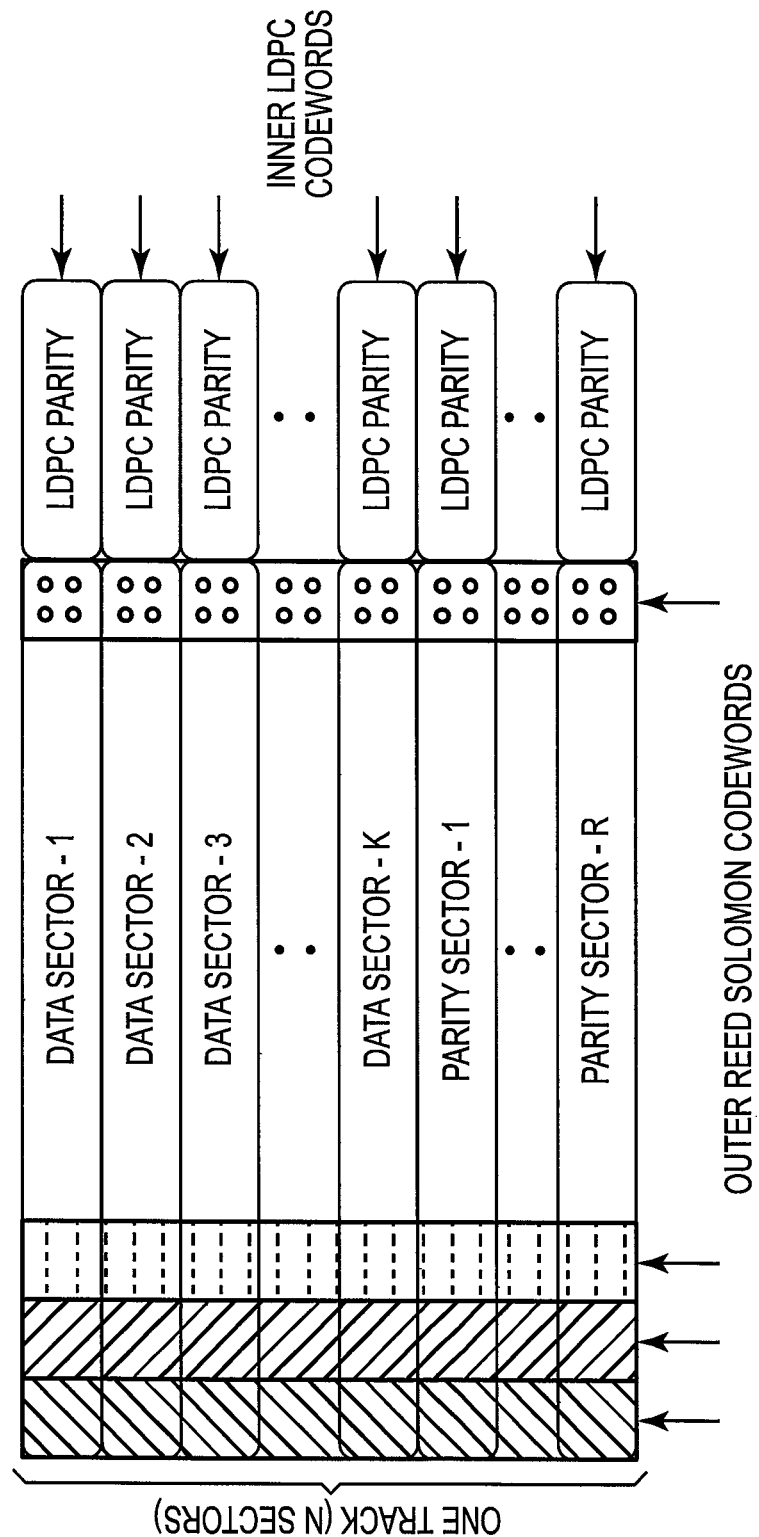
FIG. 6 shows an arrangement of inner codewords and outer codewords for one track.

An arrangement of inner and outer codes for a data track, suitable for a disc drive, is illustrated in FIG. 6. A similar arrangement would be suitable for a non-volatile memory device having blocks rather than tracks. Further, a similar arrangement would be suitable for any device concerned about data integrity, whether in space or time.

FIG. 6 illustrates one track formed of n sectors, the sectors being data sectors (1 to k data sectors) or parity sectors (1 to r parity sectors). The illustrated, track-based code is a 2D-code, where the rows are LDPC coded sectors and the columns are Reed-Solomon (RS) codewords. The first K rows form the user/data sectors and the last R rows form the parity sectors of the outer code.

The circuitry is configured for iterative outer code (IOC) decoding, which includes iterating between correcting the outer codewords and correcting the inner codewords. For example, an inner loop of iteration is done between an LDPC decoder (e.g., inner decoder 134 of FIG. 1) and a channel detector, and an outer loop of iteration is done between the inner loop and a hard-decision or a soft-decision RS decoder (e.g., outer decoder 136 of FIG. 1). If a sector fails after inner decoding (e.g., LDPC decoding), the sector is saved into a buffer. Alternately, samples of sector can be saved, as can the hard or soft decisions of the sector. When all sectors in a track have finished LDPC decoding, the RS decoder is run. Any corrected RS symbols, and hence the corresponding code bits and bit locations, are used to pin the soft input of inner code (e.g., LDPC) to maximum log-likelihood ratio (LLR) values. The outer iteration loop terminates when all sectors in a track succeed decoding or maximum IOC iterations is reached.

Reed-Solomon codes (RS) are symbol-based linear codes. In this disclosure, a Reed-Solomon code with a data length K, parity length R and symbol size S is denoted as RS (K+R, R, R+1, S). The code has code length N=K+R, and minimum distance Dmin=R+1, where Dmin determines the error correction power of a Reed-Solomon. Using classic hard-decision decoding (e.g., Berlekamp-Massey algorithm), a Reed-Solomon code can correct up to floor(R/2) errors in a codeword of length N when error locations are unknown, referred to as error correction decoding. Additionally or alternately, a Reed-Solomon code can correct up to R errors when the error locations are known, referred to as erasure decoding. The strength of a Reed-Solomon code can be indicated by its code rate K/N. The lower the code rate, the stronger a RS code. When K is a constant, increasing R (hence increasing N) reduces the code rate and increases the strength of a RS code. When R is fixed or constant, reducing K makes the code stronger.

In single-strength Reed-Solomon outer coding, as illustrated in FIG. 6, every RS codeword has the same strength with the same symbol size S, data length K and parity length R. That is, every RS codeword uses one or multiple symbols (x) from each row (i.e., each sector) to form RS codewords of parameters (xK+xR, xK, xR+1, S). Multiple symbols can be chosen from non-neighboring positions.

Figure 7:
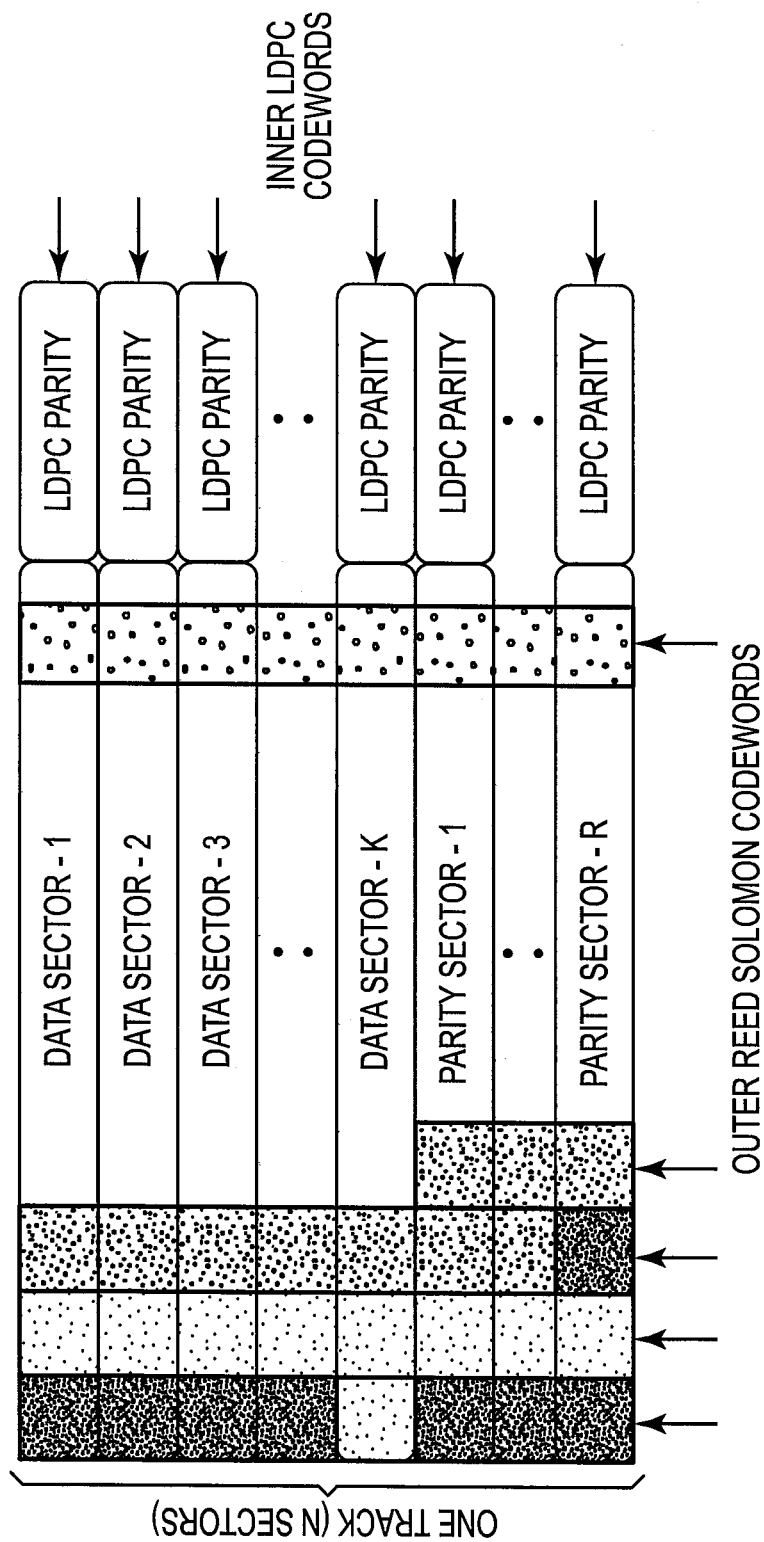
FIG. 7 shows an arrangement of inner codewords and variable strength outer codewords for one track.
Figure 8:
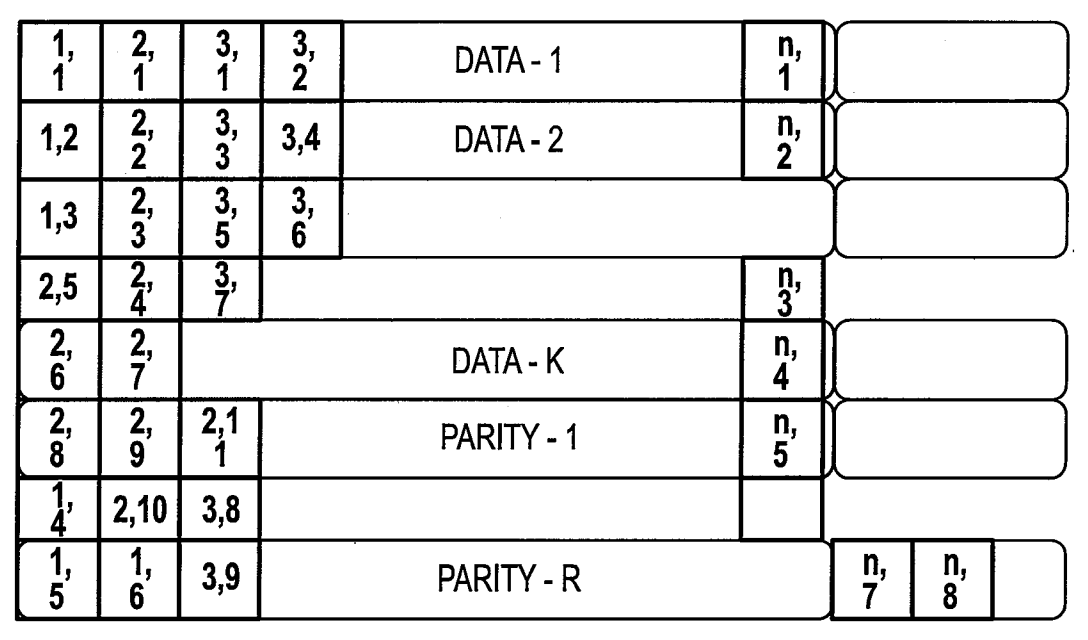
Figure 9:
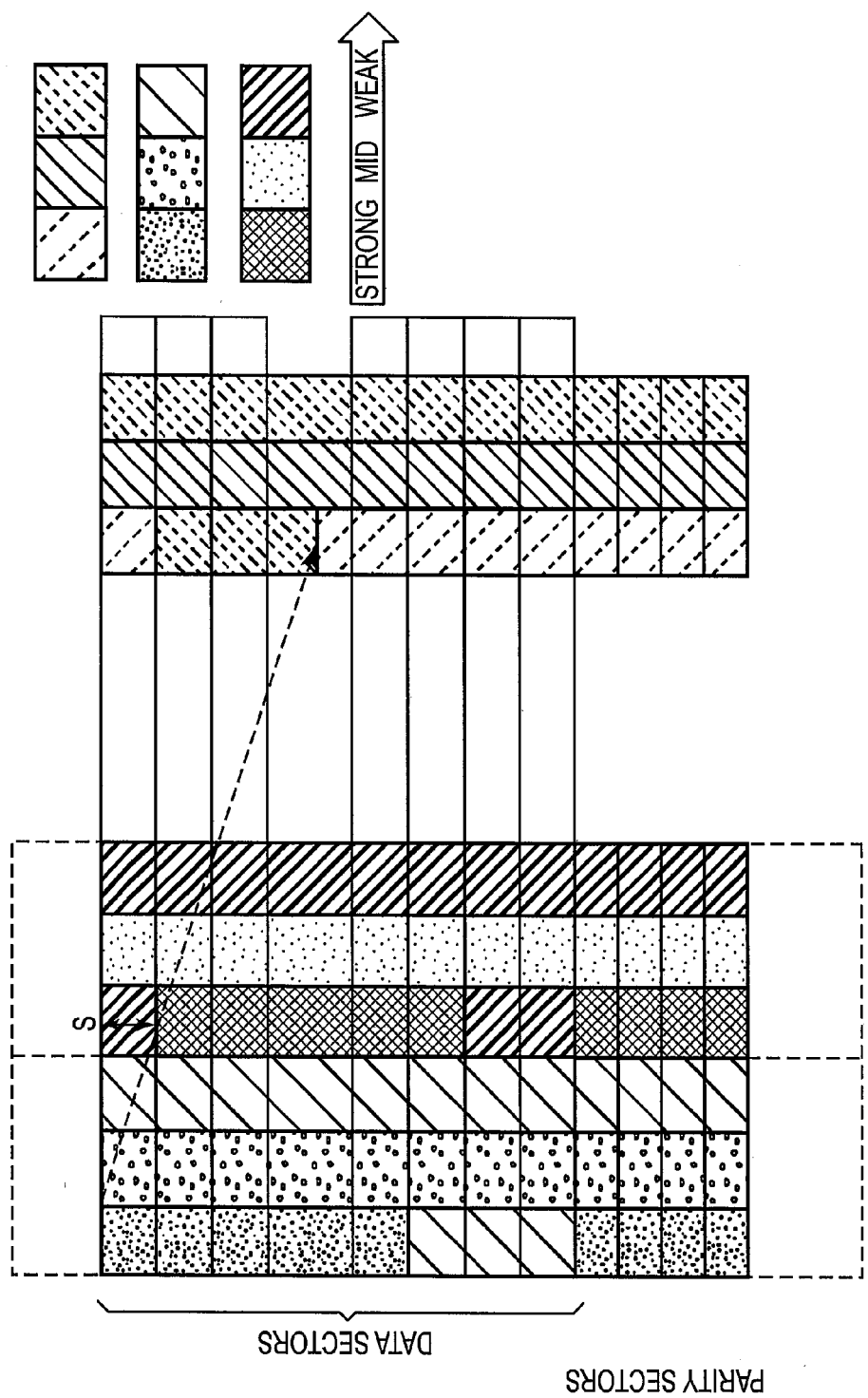
FIG. 9 shows a particular exemplary arrangement of inner codewords and variable strength outer codewords for one track.
Figure 10:
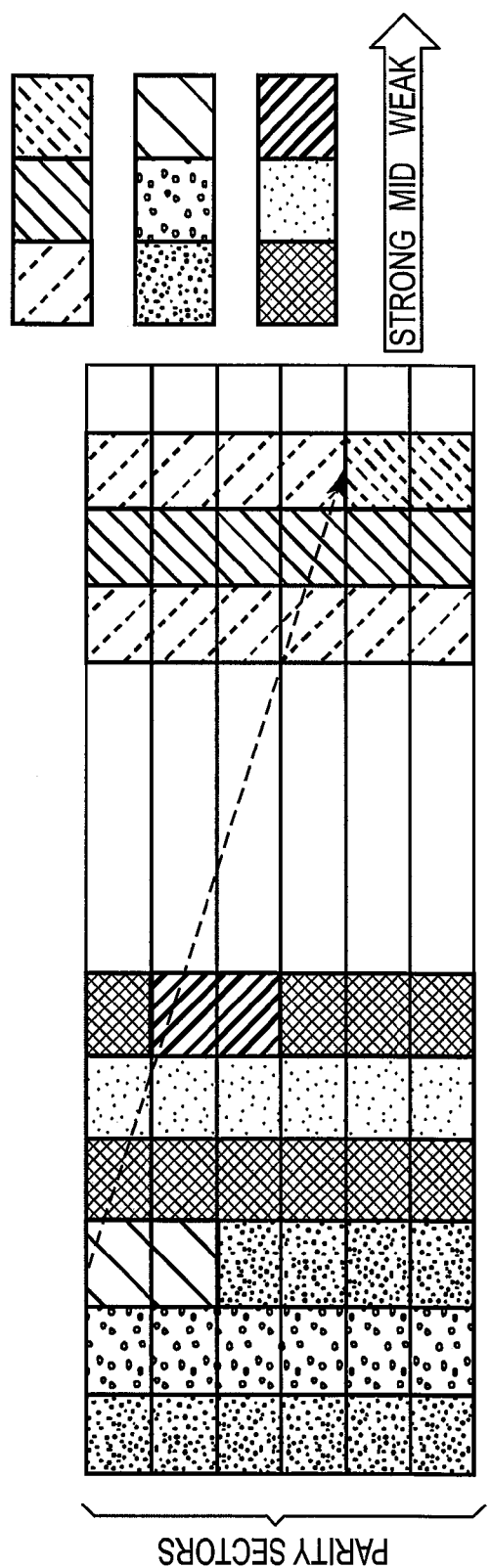
FIG. 10 shows particular exemplary arrangement of variable parity lengths for multiple-strength Reed-Solomon outer codes.

As indicated above, this disclosure is directed to utilizing multiple-strength Reed-Solomon codes as the second level, outer codes. FIGS. 7 and 8 generally illustrate multi-strength RS outer codes. FIGS. 9 and 10 are particular embodiments of multiple-strength Reed-Solomon outer codes.

An arrangement of inner codes and multiple-strength outer codes for a data track is illustrated in FIG. 7. Similar to FIG. 6, FIG. 7 illustrates one track of n sectors, the sectors being data sectors (1 to K data sectors) or parity sectors (1 to R parity sectors). The rows are LDPC coded sectors and the columns are Reed-Solomon (RS) codewords having different strengths. Although the outer codewords have different strengths, the total number of parity and data sectors is the same as in FIG. 6, thus there is no change in format efficiency.

FIG. 8 shows an example of a general look-up table construction of multiple-strength outer codes, where all symbols have the same symbol size. A general mapping function T defines the construction, with symbols of the track illustrated in matrix form. For this matrix, T(i, j)=(n, p), which maps symbol (i, j) to the $p^{th}$ symbol of the $n^{th}$ outer codeword. Multiple-strength in the outer code is achieved by varying any one of code length N, data length K, parity length R, and symbol size S.

For sectors encoded with the same inner code, equal protection from the outer codes on each sector is desirable. This can be achieved if approximately the same number of symbols from each sector are mapped to outer Reed-Solomon codewords of each strength.

In FIG. 9, a particular construction of multiple-strength outer RS codes is shown. A track having N LDPC coded sectors and the outer multiple-strength Reed-Solomon (RS) codewords, is illustrated. In this construction, all outer RS codewords have the same number of parity length R, but 3 different data lengths K. Codewords of different strengths are interleaved to reduce correlation of neighboring symbols. The middle or mid-strength RS codewords have data length K and parity length R. The weak codewords are paired with strong codewords covering two full data columns. If the strong codewords have data length D (where D<K), the weak codewords have data length 2K−D.

For equal protection of each sector by the outer codes, cyclical downshift on sectors can be performed to pick data symbols for strong RS codewords from a column. More specifically, if a strong codeword takes data symbols from column j and from rows i to i+D, the next strong codeword takes data symbols from column j+3 or j+2, depending on the number of mid-strength codewords, and rows (i+F) mod K to (i+F+D) mod K, where K is the number of data sectors and F is the cyclic shift step size. The corresponding or matching weak codeword picks up remaining symbols from the same column, at complimentary symbol locations, and symbols from a full data column to form its data symbols.

Reed-Solomon outer codes can also have variable strength by varying the number of parity symbols for different types of RS codes. The same strategy as in FIG. 9 for data sectors can be used to arrange the parity symbols for each RS code, as shown in FIG. 10. The middle or mid-strength RS codewords have R parity symbols. When the weak codewords have P parity symbols (P<R), the strong codewords have 2R−P parity symbols, where P is a subset of R.

Both the data and parity sector lengths can be varied to construct multiple-strength RS outer codes, using strategies shown in FIGS. 9 and 10. If there are C strong codewords of data length D and parity length P, there are corresponding C weak codewords of data length (2K−D) and parity length (2R−P). The middle or mid-strength codewords have data length K and parity length R. When L is the number of symbols in each sector, the multi-strength RS outer code can be denoted by: a strong code (D, P), C; a mid-strength code (K, R), L−2C; and a weak code (2K−D, 2R−P), C. If D=K and P=R, the multiple-strength outer code becomes a single strength outer code.

Tables 1 and 2, below, show various particular examples of RS codes. In these examples, it is assumed that each sector has 2864 symbols, and each track contains 256 sectors.

TABLE 1

| Strength | strong | mid | weak |
| --- | --- | --- | --- |
| Codes: | (200, 10), 1400 | (250, 6), 64 | (300, 2), 1400 |
| Code lengths: | 210 | 256 | 302 |
| Code rates: | 0.95 | 0.977 | 0.993 |

TABLE 2

| Strength | strong | mid | weak |
| --- | --- | --- | --- |
| Codes: | (80, 6), 1400 | (250, 6), 64 | (420, 6), 1400 |
| Code lengths: | 86 | 256 | 426 |
| Code rates: | 0.93 | 0.977 | 0.986 |

For the multiple-strength RS outer code, outer codewords have varying data lengths and code rates. However in some embodiments, all outer codewords may have constant parity, that is, have the same number of parity symbols, which is equal to the number of parity sectors R.

Utilizing the above-described two-level data protection for data blocks, particularly, low density parity check (LDPC) codes as the first level as inner codes and multiple-strength Reed-Solomon codes as the second level as outer codes, improved devices are obtained. The devices can be any that are concerned about data integrity, such as data storage or memory devices, and communication systems. The two-level data protection may be used, for example, in memory devices such as hard disc drives (HDD), solid state drives (SSD), two-dimension magnetic recording (TDMR), and multi-sensor magnetic recording (MSMR). The two-level data protection may be used, for example, in communication devices and communication systems that operate with at least one of a satellite communication system, a wireless communication system, a wired communication system, and a fiber-optic communication system.

In the preceding description, reference is made to the accompanying drawing that forms a part hereof and in which are shown by way of illustration at least one specific embodiment. The preceding description provides additional specific embodiments. It is to be understood that other embodiments are contemplated and may be made without departing from the scope or spirit of the present disclosure. The preceding detailed description, therefore, is not to be taken in a limiting sense. While the present disclosure is not so limited, an appreciation of various aspects of the disclosure will be gained through a discussion of the examples provided above.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

Thus, embodiments of the MULTI-STRENGTH REED-SOLOMON OUTER CODE PROTECTION are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A coding device comprising encoder circuitry configured to encode data into low density parity check (LDPC) inner codewords and multiple-strength Reed-Solomon (RS) outer codewords, wherein each Reed-Solomon outer codeword has a code length N equal to the sum of a data length K and a number of parity length R, and has a symbol size S and a code rate K/N, wherein the strength of the outer codewords is varied by changing at least one of the code length N, data length K, parity length R, symbol size S and code rate K/N to form a plurality of multiple-strength RS outer codewords, wherein each of the multiple RS outer codewords form a column that include data sector rows and parity sector rows, a total number of parity and data sectors remaining the same even with outer codewords of different strengths, and wherein LDPC codes as first level inner codewords are corrected with multiple-strength RS outer codewords as second level outer codewords starting with the lowest code rate (K/N) to iteratively correct data in a two level data protection mode.

2. The device of claim 1 wherein the coding device is part of a memory device.

3. The device of claim 2 wherein the memory device is one of a hard disc drive (HDD), a solid state drive (SSD), a two-dimension magnetic recording (TDMR) device, and a multi-sensor magnetic recording (MSMR) device.

4. The device of claim 1 wherein the coding device is part of a communication system.

5. The device of claim 4 wherein the communication system is one of a wireless communication system, a wired communication system, and a fiber-optic communication system.

6. The device of claim 1 further comprising modulator circuitry configured to store the inner codewords and the Reed-Solomon outer codewords.

7. The device of claim 6 further comprising:
demodulator circuitry; and
decoder circuitry configured to decode the inner codewords and the outer codewords and to correct errors in the inner codewords and the outer codewords.

8. The device of claim 7, wherein the decoder circuitry is configured to iterate between correcting the outer codewords and correcting the inner codewords.

9. The device of claim 1 wherein the device includes a plurality of Reed-Solomon outer codeword columns, and wherein the multiple-strength Reed-Solomon outer codewords comprise strong codewords having a lower code rate K/N than midstrength codewords, mid-strength codewords having a lower code rate than weak codewords, and weak codewords which are paired with strong codewords over more than one Reed-Solomon outer codeword column.

10. The device of claim 9 wherein a weak codeword is combined with a strong codeword to fill at least two data and/or parity columns.

11. The device of claim 1 wherein the code length N is fixed, and data length K and parity length R vary.

12. The device of claim 1 wherein the data length K is fixed, and parity length R and code length N vary.

13. The device of claim 1 wherein the Reed-Solomon outer codewords are present in a plurality of data and/or parity sectors, and every sector has equal protection from multiple-strength outer codes.

14. A method comprising:
constructing inner codes and low density parity check (LDPC) codes;
constructing a plurality of Reed-Solomon (RS) codeword columns including Reed-Solomon outer codewords having a code length N, data length K, parity length R, and symbol size S, and varying the strength of the outer codes by changing at least one of the code length N, data length K, parity length R, and symbol size S to form a plurality of multiple-strength RS outer codewords, wherein each of the RS outer codewords form columns that include data sector rows and parity sector rows, a total number of parity and data sectors remaining the same even with outer codewords of different strengths; and
iterating with a coding device between correcting the outer codewords and correcting the inner code, wherein the low density parity check (LDPC) codes as first level inner codewords are corrected with multiple-strength RS outer codewords as second level outer codewords starting with the lowest code rate (K/N) to iteratively correct data in a two level data protection mode.

15. The method of claim 14 wherein varying the strength of the outer code comprises fixing the code length N and varying the data length K and the parity length R.

16. The method of claim 14 wherein varying the strength of the outer code comprises fixing the data length K and varying the parity length R and the code length N.

17. The method of claim 14 wherein constructing Reed-Solomon outer codes comprises constructing Reed-Solomon outer codes so that every data and parity sector has equal strength protection from varying strength outer codes.

18. The method of claim 17 wherein the Reed-Solomon outer codewords are present in a plurality of data and/or parity sectors within each Reed-Solomon codeword column and a weak codeword is combined with a strong codeword to fill two data or parity columns.

19. A method of providing two-level data protection in a coding device, the method comprising:
constructing inner codes and low density parity check (LDPC) codes;
constructing a plurality of error correcting codeword columns including error correcting outer codewords having a code length N, data length K, parity length R, and symbol size S, and varying the strength of the outer codewords by changing at least one of the code length N, data length K, parity length R, symbol size S and code rate K/N to form a plurality of varying-strength outer codewords, wherein each of the varying-strength outer codewords form a column that include data sector rows and parity sector rows, a total number of parity and data sectors remaining the same even with outer codewords of different strengths;
storing the variable strength error correcting outer codewords in a plurality of data or parity sectors; and
performing a cyclical downshift on the sectors to provide equal protection across the sectors from the variable strength outer codes such that the low density parity check (LDPC) codes as first level inner codewords are corrected with the variable strength outer codewords as second level outer codewords starting with the lowest code rate (K/N) to iteratively correct data in a two level data protection mode.

* * * * *